United States Patent [19]

Gorczak

[11] Patent Number: 5,402,087
[45] Date of Patent: Mar. 28, 1995

[54] VOLTAGE CONTROLLED PUSH-PUSH OSCILLATOR

[75] Inventor: Roman T. Gorczak, Markham, Canada

[73] Assignee: B.E.L.-Tronics Limited, Mississauga, Canada

[21] Appl. No.: 225,308

[22] Filed: Apr. 8, 1994

[51] Int. Cl.$^6$ .............................................. H03B 5/18
[52] U.S. Cl. .................................. 331/117 D; 331/96; 331/114; 331/177 V
[58] Field of Search ................... 331/96, 99, 100, 101, 331/102, 117 R, 117 FE, 117 D, 107 DP, 107 SL, 114, 36 C, 177 V

[56] References Cited

U.S. PATENT DOCUMENTS

| | | | |
|---|---|---|---|
| 4,485,355 | 11/1984 | Scott | 331/117 D X |
| 4,754,236 | 6/1988 | Mamodaly et al. | 331/117 FE |
| 4,763,084 | 8/1988 | Pavio, Jr. et al. | 331/117 D X |
| 4,783,638 | 11/1988 | Mamodaly et al. | 331/117 D X |
| 5,231,361 | 7/1993 | Smith et al. | 331/117 D X |
| 5,289,139 | 2/1994 | Fiedziuszko et al. | 331/117 D X |

OTHER PUBLICATIONS

Shipow: "Linearity In Solid State Microwave Voltage Tuned Oscillators" *Microwave Journal*, Feb. 1983, pp. 130–138.
Bender et al: "Push–Push Design Extends Bipolar Frequency Range" *Microwaves & RF*, Oct. 1983, pp. 91, 92, 94, 96, and 98.

*Primary Examiner*—David Mis
*Attorney, Agent, or Firm*—Donald E. Hewson

[57] ABSTRACT

A voltage controlled push-push oscillator is provided having a variable frequency output over a range of frequencies. Usually, the range of frequencies is in the microwave range. The configuration is such that the collectors of a pair of transistors are tied together, and an inductive reactance is provided across the base and collector of each of the transistors, with the emitters of the pair of transistors being each connected to opposite phases (at the fundamental frequency) of a resonator which may comprise of one or more elements, bisected to provide an output tap at which an RF null at the fundamental frequency and an anti-null at the second harmonic exists, whereby the second harmonic output frequency of the push-push oscillator is derived. Particularly when the push-push oscillator operates at microwave frequencies, the resonator element is a microstrip line, having the output tap at the centre thereof. A source of DC voltage is connected to the commonly connected collectors, a source of variable DC tuning voltage is connected to each of the bases of the transistors, and a DC current source is connected to each emitter whereby a common current source can supply the sum of the emitter currents, whereby the RF voltage null (at the fundamental frequency) at the resonator centre is utilized to isolate the fundamental frequency signal from the current source, which is connected through a bias choke which in turn isolates the current source from the second harmonic. The output is twice the operating frequency of each transistor and is produced by each transistor to have the same phase relationship (push-push). The second harmonic is produced by the nonlinearities of the transistor pairs which oscillate at the fundamental oscillating frequency whereby the fundamental signal is opposite in phase with respect to each transistor (push-pull). Output power is derived from the transistors so as to maintain the same phasing at the second harmonic and opposite phasing at the fundamental oscillating frequency whereby the fundamental is cancelled and second harmonic added, such as when a centre tapped resonator with even symmetry about the output tap is used as the output.

14 Claims, 3 Drawing Sheets

PRIOR ART

VOLTAGE CONTROLLED PUSH-PUSH OSCILLATOR

FIELD OF THE INVENTION

This invention relates to voltage controlled push-push oscillators. While push-push oscillators according to the present invention may operate at varying frequencies, specific embodiments of the push-push oscillator are intended to operate at microwave frequencies.

BACKGROUND OF THE INVENTION

Oscillators are used in many electronics circuits to provide an AC signal having a predetermined frequency. The oscillator signal may be used as a reference signal, and often it is used as one of the input signals to a mixer, where it will be combined with incoming signals at a different frequency, with the sum or difference of the two input signals being derived as an output signal. A common circumstance is when high frequency radar signals are mixed with oscillator signals which are usually of a lower frequency so as to produce an intermediate signal frequency signal which may be considerably lower in frequency.

It is sometimes required to provide an oscillator which may have a varying frequency output over, generally, a fairly limited range of frequencies. This may be useful, for example, to provide a swept input signal to a mixer to determine the presence of a higher frequency signal which may, itself, be within a specified range of frequencies and to output an intermediate frequency signal in the presence of such an input signal having been detected. For example, an incoming radar signal might be anywhere in the range of, say, from 33.4 GHz to 36.0 GHz, where the incoming radar signal could be present anywhere within that band and it is necessary to sweep a local oscillator frequency over a range of frequencies in order to develop an intermediate frequency resultant signal within a specified frequency band where the intermediate frequency signal may be further handled and analyzed.

Voltage controlled push-push oscillators have been known for some period of time, particularly because they provide a proven design that has twice the output frequency capability of any single-transistor microwave voltage controlled oscillators. This is because the output frequency of a push-push transistor voltage controlled oscillator is twice the operating frequency of either of the transistors that are present in the circuit, where the transistors operate in an anti-phase or push-push mode and produce in phase or push-push second harmonics. The output frequency is extracted from the circuit at a point of fundamental null and second harmonic maxima, and thus has a frequency that is twice the frequency at which each of the transistors oscillates. However, until now, push-push transistor voltage controlled oscillators have generally operated in a configuration where the collectors of each of the pair of transistors are grounded, the emitters of the transistors are connected through a capacitance to ground in each instance, and the bases of the transistors are connected through inductance elements to each other with the output frequency from the oscillator being extracted at a balance point between the bases.

In contradistinction to the prior art, the present invention provides a push-push oscillator which is distinguished by the fact that the transistors may be connected to each other in a common collector configuration, and in any event are connected so as to be AC grounded at the output frequency of the oscillator. Although the push-push oscillator of the present invention is capable of operating at a frequency which may be chosen over a very broad range of frequencies, it generally is intended to operate in the microwave frequency so as to have an output frequency that may be in the range of from about 9 GHz up to about 18 GHz. Because the push-push oscillator is a voltage controlled oscillator, its output will have a particular bandwidth, and usually when the oscillator is working in the microwave frequency range the bandwidth would be about 3.0 GHz—i.e., 1.5 GHz±based on a centre frequency. When such a push-push voltage controlled oscillator is utilized in a commercial embodiment such as a radar detector, it is usual that bipolar transistors are preferred because they have better second harmonic characteristics due to inherent non-linearities.

The principle embodied in any push-push oscillator, of using two transistors to generate harmonics and then cancelling out the fundamental frequency at which either of the transistors operates, is well known, as noted above. However, quite unexpectedly, the present inventor has determined that a better and more efficient push-push oscillator may be obtained, giving among other advantages the fact that the output frequency may be extended to a higher frequency of operation for similar devices than that of previous designs, because the emitters of the pair of transistors used in the push-push oscillator are connected to the resonator element which is included in the push-push oscillator design. Moreover, while the resonator element in general may comprise a bisected resonator element that has a pair of half-elements that are arranged such that an output tap is placed between the bisected half-elements. At that point, there will exist an RF null at the oscillating frequency of each of the pair of transistors, and an anti-null at the output frequency of the oscillator. Moreover, it has been found to be particularly advantageous to utilize a microstrip resonator as the resonant element. In that case, as discussed in greater detail hereafter, the microstrip itself is bisected in a manner so as to have an output tap at which the output frequency of the push-push oscillator is derived. At the same point, the fundamental or oscillating frequency of each of the transistors is cancelled, thereby creating a null at that frequency.

In order to drive the push-push oscillator, it is necessary to provide a DC source of voltage which, in the present invention, is connected directly to the commonly connected collectors; a source of DC current which is connected to the output tap of the resonator element or elements and thus to each of the emitters of each of the pair of transistors; and a source of variable DC tuning voltage which is connected to each of the bases of the pair of transistors.

Certain other advantages are derived from the present invention, particularly when bipolar transistors are connected in the common collector configuration and the resonator element is a microstrip resonator. They include the fact that bipolar transistor circuits having an inductive collector to base impedance present the resonator with a complex impedance, which will have a negative real component in a frequency domain around the oscillating frequency of each transistor. Moreover, the design of a microstrip resonator element may be arranged so that it has a length which is at least one-half the wavelength of the highest oscillating frequency at which each transistor is intended to be driven plus enough extra length at each end of the microstrip resonator element which is remote from the output tap, so as to provide a capacitive reactance whose function is to contribute to the resonant circuit whereby the oscillating frequency of each of the respective transistors in the push-push oscillator may be governed. This comes, of course, from the fact that a resonant circuit may generally be defined as being an LRC circuit, utilizing an inductance, resistance (or negative resistance), and capacitance in the well known manner.

However, the present invention provides circuits whereby the negative resistance between the emitter and collector of each of the transistors utilized in the circuit may be obtained or achieved by converting the collector to base reactance of each transistor, which is capacitive in nature, to become net inductive at the oscillating frequency of each transistor. This results in an inductive reactance appearing in parallel with a negative resistance. This, in turn, permits the emitter of each of the transistors utilized in the push-push configuration of voltage controlled oscillator according to the present invention to provide return gain (as seen from the emitter port) at frequencies that are in range of and may even exceed the transition frequency of the transistors being utilized.

Thus, the present invention is contrary to usual practice where emitter output would not be utilized for derivation of output frequency from each transistor, since biasing is more difficult because, from a DC point of view, there would be less feedback to ensure that each transistor is operated at the same current if the emitters are DC connected through the resonator, thus requiring transistors with matched DC parameters. The present invention does, however, utilize emitter output where the emitters of the push-push oscillator are connected to the resonator in such a manner that an output tap will exist between the resonator elements—which may be lumped elements or distributed reactances—and where the output tap is derived at a point between the lumped elements or midway along a distributed resonator element such that there will be an RF null at the oscillating frequency of each of the pair of transistors, and there will be an anti-null at the output frequency of the oscillator.

It must not be overlooked, of course, that any push-push oscillator must rely on the generation of signals from each transistor that are rich in second harmonic components because the fundamental components will cancel since the transistors operate in a push-pull mode at the fundamental, and therefore it is the second harmonic component which must be present and which gives the output frequency at twice the fundamental or oscillating frequency of each of the transistors. However, in the prior an where push-push voltage controlled oscillators were configured having resonators connected to the bases of each transistor, then saturation of the transistors was relied upon in order to generate the rich second harmonic component. On the other hand, in keeping with the present invention, if the resonator element is connected to emitter of each of the transistors that is used in the voltage controlled oscillator, then transistor cut-off is the principal characteristic that is relied upon so as to generate the non-linearity. This, in turn, allows for much higher frequency of operation, since transistor cut-off switching does not reduce the frequency response of the transistors as it does with transistor saturation.

BRIEF DESCRIPTION OF THE DRAWINGS

The invention will be described in greater detail hereafter, in association with the accompanying drawings which are for purposes of discussion only, and in which.

DETAILED DESCRIPTION OF THE PREFERRED EMBODIMENTS

Reference will now be made to FIGS. 1 to 4.

Figure 1:
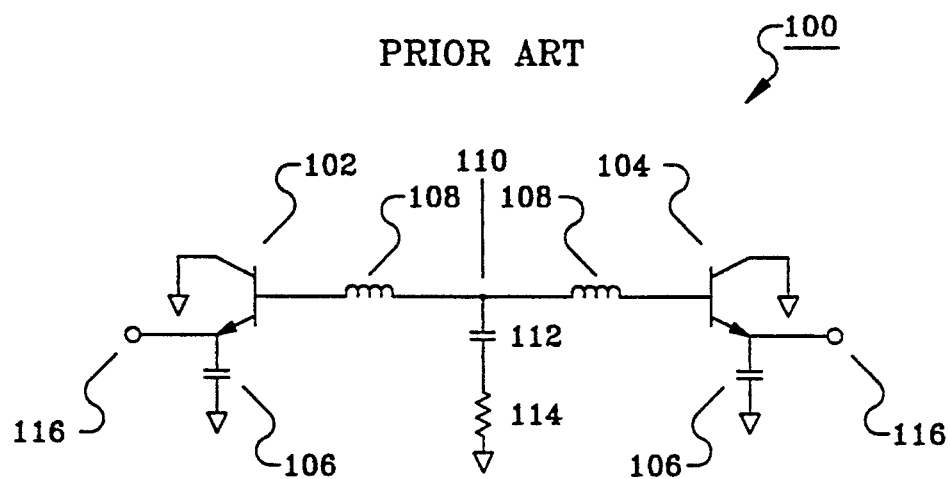
FIG. 1 is a representation of a typical prior art push-push voltage controlled oscillator.

First, referring to FIG. 1 and recalling some discussion above, a prior art push-push oscillator 100 is provided. This oscillator utilizes a pair of transistors 102 and 104, where the collectors of each of the transistors are connected to ground, and the emitters of each of the transistors are connected to grounded capacitors 106—which are essentially identical to each other. A pair of lumped element inductances 108 is connected one to each base of transistors 102 and 104, and a balance point 110 is found between them. An AC output is extracted through DC blocking capacitor 112 to a load which is indicated as being 114. Tuning voltage may be applied at point 110, and DC power may be supplied at points 116.

As discussed above, a prior art circuit such as that of FIG. 1 suffers several disadvantages over those of the present invention as discussed hereafter, including the fact that its performance and upper frequency limit is lower, and that it relies upon transistor saturation in order to generate harmonics.

Figure 2:
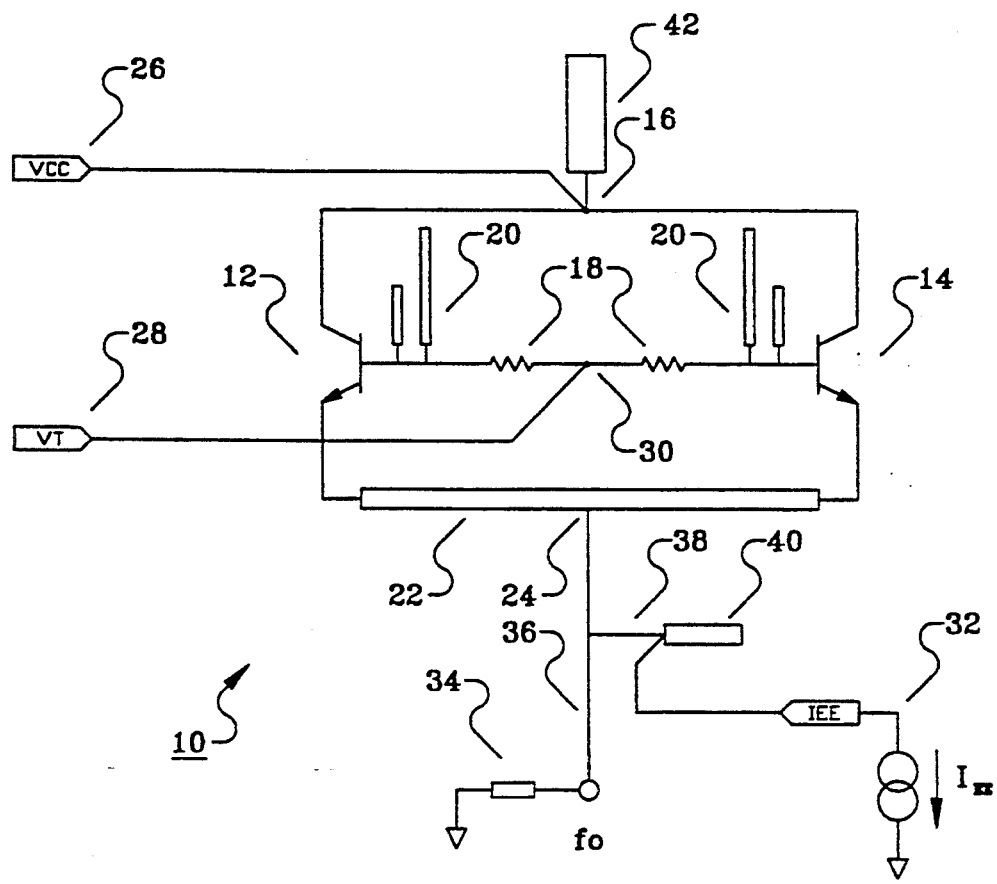
FIG. 2 is a representation of a first embodiment of a voltage controlled oscillator in keeping with the present invention, in which certain distributed circuit elements are provided.

A first embodiment of the present invention is shown in FIG. 2. Here, a push-push voltage controlled oscillator 10 is shown, comprising a pair of transistors 12 and 14. It will be noted that the collectors of transistors 12 and 14 are tied together, and that they have a centre point which is indicated at 16. The bases of transistors 12 and 14 are tied together through a pair of resistance elements 18, whose purpose is to supply bias voltage and to present a high impedance; and that at least one microwave stub which is open circuited within the range of oscillating frequencies of each of transistors 12 and 14, is connected to the base of each of those transistors. A microstrip resonator element 22 is connected to each of the emitters of transistors 12 and 14, and it has output tap 24 at the centre of the resonator element 22, as discussed above.

A DC voltage source $V_{cc}$ 26 is provided, and it is connected to the commonly connected collectors of transistors 12 and 14, at the midway point 16 between them. However, it should also be noted that it is not necessary that the collectors of transistors 12 and 14 be commonly connected, provided that the collectors are each AC grounded at least at the oscillating or fundamental frequency of each transistor and also at the output frequency of the oscillator—which is twice the oscillating frequency of each transistor. In that case, voltage source $V_{cc}$ is connected individually to each collector.

A source of variable DC tuning voltage 28 is connected to a point 30 which is midway between the bases of the transistors 12 and 14, so as to provide equal tuning voltage to each transistor. A DC current source 32 is connected to the voltage controlled push-push oscillator 10 at the output tap 24 of the resonator element 22.

The output frequency from the oscillator 10 is derived from the output tap 24, and is imposed across a load 34, the other end of which is connected to ground. Also connected to the output line 36 is a choke which comprises line 38 and stub 40, each of which has a length of ¼ of the wavelength of the output frequency. The choke 38, 40 has the purpose to act as an output frequency block, so that signals at the output frequency of the oscillator 10 as they are derived from the output tap 24 are not passed through to the current source 32.

Also connected to the midway point 16 between the collectors of the transistors 12 and 14 is a microwave stub 42, whose purpose is to provide a short circuit to ground at the output frequency $f_o$ of the oscillator 10. It will also be observed that, if both halves of the oscillator 10—i.e., transistors 12 and 14, associated stubs 20, associated resistance elements 18, and the associated halves of microstrip resonator 22—are identical one to the other, then a virtual short circuit to ground at the oscillating frequency of each of the transistors 12 and 14 will be developed at midway point 16.

It should also be noted that utilization of a microstrip resonator 22 would be effectively precluded in prior art push-push oscillators operating in an upper microwave frequency range. For example, in a circuit such as that shown in FIG. 1, and utilizing packaged transistors for 102 and 104, the parasitic base lead inductance that would exist in the packaged transistors would exceed the requisite inductance values for the operating frequency. In turn, this means that zero or smaller external resonator length is required, which is not physically realizable. Thus, transistors 102 and 104 could not be mounted close enough to each other. However, an embodiment such as those of FIGS. 2 and 3 is practical.

Figure 3:
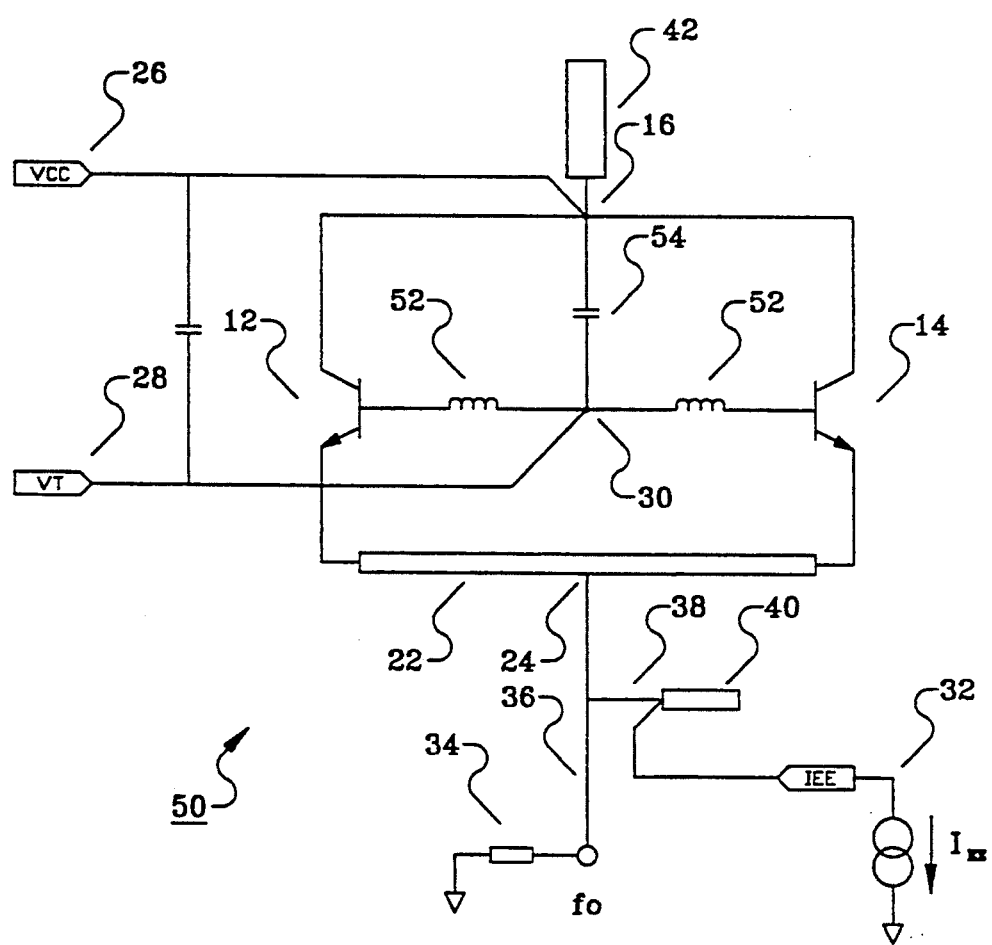
FIG. 3 is a representation of a second embodiment of a push-push voltage controlled oscillator according to the present invention, where greater utilization of discrete elements is achieved.

A similar, but more advanced, circuit for a voltage controlled push-push oscillator is shown in FIG. 3. There, the push-push oscillator 50 is shown to comprise a number of essentially identical elements as those shown in the circuit of FIG. 2, and they are therefore designated with the same reference numerals. However, several differences are to be noted. Particularly, in the place of microwave stubs 20 and resistor elements 18, there are inductors 52 connected to each of the bases of transistors 12 and 14, and also there is a capacitor 54 shown being connected between the midway point 16 and the common point 30 between the bases. However, those elements may, in fact, be lumped elements that exist as a consequence of the manufacture and mounting of the transistors. Thus, any inductance that may come as a consequence of the base bond and/or lead inductances associated with the bases of each transistor 12 and 14 will contribute to the required inductance that is otherwise indicated by elements 52.

At this point, it should be noted that the strip line resonator 22 of either FIG. 2 or FIG. 3 could be replaced such as by using a pair of capacitors. However, in order to obtain the output frequency from the oscillator—being the second harmonic of each of the transistors—a centre-tap between two series capacitors would be required. This, in turn, would require that there must be additional DC bias circuitry in order to provide bias voltage to the transistors, giving rise to higher complexity of the circuit design. Moreover, such an arrangement would be much less easy to replicate and to automate as to its production in commercial quantities. Thus, while the use of a pair of resonator elements which are connected in back-to-back relationship with a balance point or output tap therebetween and also being connected to the emitters of the pair of transistors is not precluded, at least for high frequency operation the use of a microstrip resonator element is preferred.

Several further advantages arise from circuits such as those shown in FIGS. 2 and 3 that utilize a shunt collector to base inductor element and a resonator between the emitters of the pair of transistors. They include the fact that if each transistor's internal parasitic collector to base capacitance is to be used as the tuning element, then the region of negative resistance or return gain, as seen looking into the emitter of each respective transistor will track the tuned oscillating frequency.

Moreover, as indicated above, the base bond and/or lead inductance may be utilized. This comes from the fact that there is generally a parasitic impedance which will be present in the base lead, and this fact permits easy physical placement of each transistor. In light of that, inadvertent occurrences of spurious resonant circuits—which may often occur in microwave circuit design—can be quite well minimized.

When the collectors of the transistors are tied together so as to provide a virtual short circuit to ground at the oscillating frequency of each transistor, biasing of the transistors can be simplified by reducing the need to decouple the collectors just at the second harmonic frequency—which is achieved through the use of stub 42.

Also, the virtual short circuit to ground that occurs between the base inductors 52 in FIG. 3 will ensure that those inductors are coupled to the collectors by a virtual short circuit at the oscillating or fundamental frequency of each transistor, thus simplifying the biasing requirements for the transistors. Still further, particularly with respect to a circuit such as that shown in FIG. 3, there will be lower high frequency signal losses because resistors, such as resistors 18 in FIG. 2, will not be required to provide high frequency isolation for biasing purposes.

Figure 4:
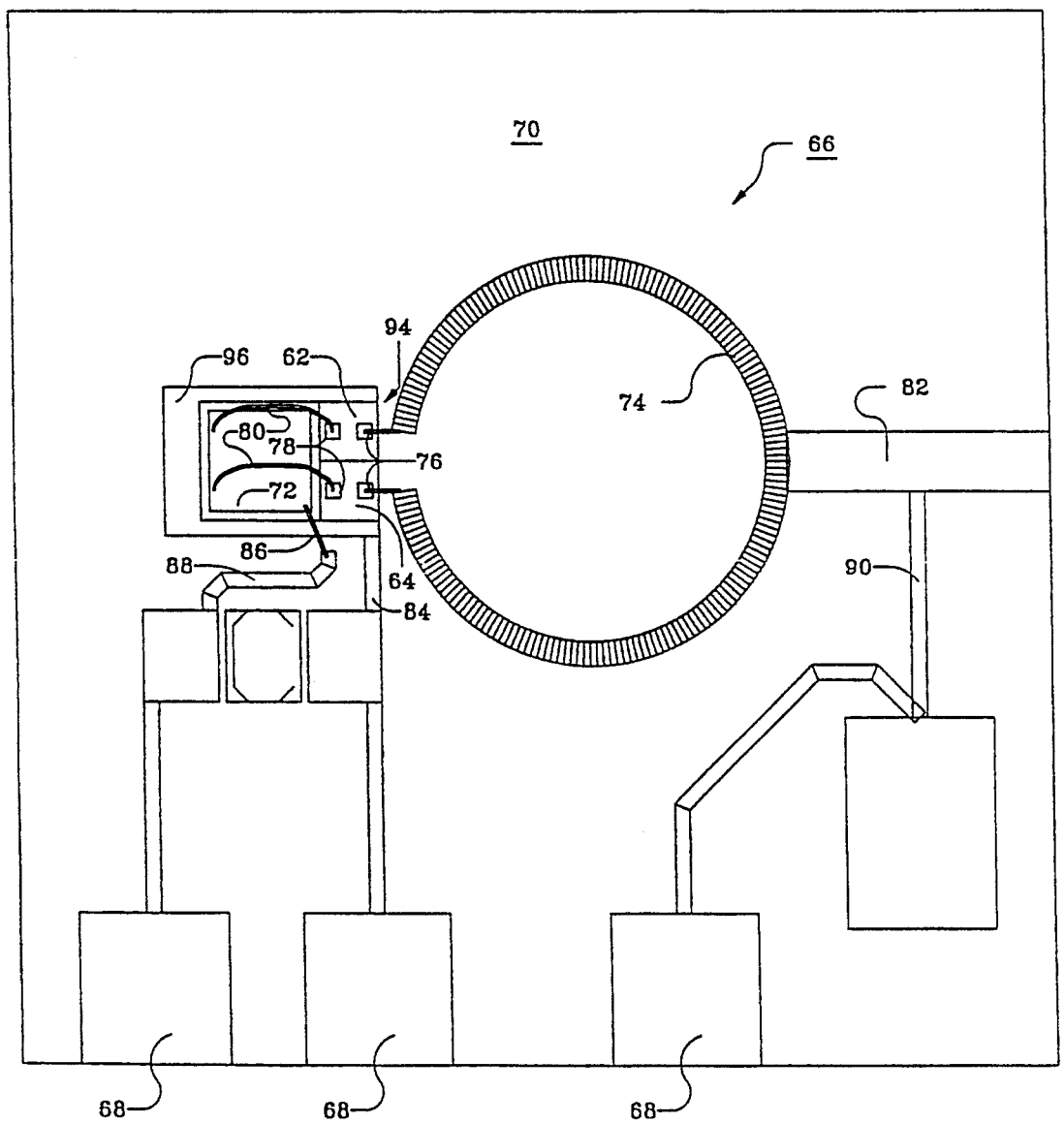
FIG. 4 is a physical embodiment of a circuit schematically represented in FIG. 3 utilizing a monolithic matched pair of transistors.

Now, referring to FIG. 4, yet a further benefit that may be derived from the present invention is shown. Here, what is illustrated is essentially a physical embodiment of a circuit in keeping with FIG. 3, where a monolithic dual matched transistor pair is utilized. Here, transistors 62 and 64 are shown, and they are a pair of transistors that is a monolithic chip of matched transistors on a common substrate. The pair of transistors has their collectors connected through the common substrate, which is the back of the wafer for each transistor. This comes as a consequence of the manufacture of single transistors, where a monolithic dual matched transistor pair with substrate connected collectors can be made by appropriate cutting of existing manufactured transistor wafers intended for single devices, allowing the use of existing popular low cost devices.

In any event, what is shown in FIG. 4 is a representative hybrid circuit embodiment having some bond wire connections, which may be easily adapted to automatic production using well known circuit component emplacement machinery that is well adapted to production of hybrid circuit board electronic devices. The precise design is, of course, determined according to the components to be used, the machinery to be used to construct the circuit, the characteristics of the hybrid circuit board which is to be utilized, its ground plane, and so on. In any event, a hybrid circuit board 70 is provided on which a manufactured push-push voltage controlled oscillator 66 is placed. Here, typical edge connection pads 68 are shown, to which various leads carrying varying signals, voltages, etc., can be connected using the high thermal conductivity of an alumina substrate to allow for easy solder bridging of the hybrid to another printed circuit board. The substrate connected transistors 62 and 64 are mounted at the short circuit end 94 of an open circuited stub 96 on the hybrid circuit board 70, which has a ground plane (not shown), and a capacitance element 72 is shown being placed on the same stub 96 directly behind the transistors 62 and 64. Capacitance element 72 is a metal insulator semiconductor chip capacitor whose top contact plane interconnects inductors 80 and the base tuning voltage, and provides the AC return path to couple the inductors to the transistor collectors via the low impedance metallization of stub 96. In any event, there is also placed on the printed circuit board 70 a microstrip resonator element which is shown generally at 74. The microstrip resonator element 74 is connected at each of its ends to a respective emitter pad 76 on each of transistors 62 and 64. More importantly, a pair of bond wires provides the inductors 80, each is of a predetermined length, and each is connected to respective base connection pads 78 on transistors 62 and 64. The bond wire inductors 80, in fact, provide inductance elements such as inductance elements 52 in FIG. 3.

The output frequency $f_o$ from the oscillator 66 of FIG. 4 is derived from an output tap of the resonator element 74, and is fed away from it along microstrip 82. The DC bias voltage such as that from source 26 in FIG. 3 may be delivered to the commonly connected collectors of transistors 62 and 64 from circuit lead 84. Likewise, the source of variable DC tuning voltage may be delivered to the capacitance element 72 from bond wire 86 which comes off circuit lead 88. The DC current source (not shown) may be fed to the output tap on the resonator element 74 along line 90.

Thus, FIG. 4 shows a practical embodiment of a circuit such as that shown in FIG. 3, which may be easily manufactured using automated die attachment and bonding machinery.

Referring back to FIGS. 2 and 3, it can be seen that the base to collector inductor paths may be provided by lumped elements, or as a consequence of the presence of distributed elements. Also, as discussed above, a virtual short circuit to ground at the oscillating frequency of each of the pair of transistors is developed at a point which is physically located midway between the collectors of the pair of transistors; and at that same point, a microwave stub may be connected so as to provide a short circuit to ground at the output frequency of the push-push oscillator—which is twice the oscillating frequency of each of the pair of transistors.

In general, in practical embodiments such as when employed in radar detectors, push-push oscillators according to the present invention are provided where each of the pair of transistors operates in the microwave frequency range, and the upper and lower limits of the bandwidth at which the push-push oscillator operates are also within the microwave frequency range.

When a microstrip resonator is used, its length is such that at each side of the output tap there is at least one-quarter the wavelength at the fundamental oscillating frequency of each transistor, plus a sufficient extra length so as to provide a capacitive impedance to each respective transistor emitter. The function of the capacitive impedance is to contribute to the resonance circuit whereby the oscillating frequency of each of the respective transistors is governed.

Finally, the output frequency of the oscillator may be in the range of from about 9 GHz to about 18 GHz, with the bandwidth of the range of the output frequencies through which the output frequency is swept being about 3.0 GHz—i.e., 1.5 GHz±based on a predetermined centre frequency.

There has been described a voltage controlled push-push oscillator which is particularly adapted for use in microwave frequency circuits, but by appropriately changing values of elements being used, and the use of lumped elements, may be designed and manufactured so as to operate at lower frequencies. Particularly, when push-push oscillators in keeping with the present invention are to be utilized at microwave frequencies, embodiments have been provided that utilize specifically manufactured monolithic dual matched pairs of transistors, and the manufacture of the push-push oscillator circuits may be easily automated for high productivity.

The scope of the present invention is defined by the appended claims.

What is claimed is:

1. A voltage controlled push-push oscillator having a variable frequency output over a range of frequencies, wherein said push-push oscillator includes a pair of transistors each capable of having an oscillating frequency which is at least one-half the highest output frequency to be derived from said push-push oscillator, a bisected resonator element, a source of DC voltage, a source of variable DC tuning voltage, and a source of DC current; wherein an inductive reactance is provided across the base and the collector of each of said transistors, the collectors of said pair of transistors are each AC grounded at least at the oscillating frequency of each transistor and at twice the oscillating frequency of each transistor, so that the collectors of said pair of transistors are AC grounded at the output frequency of said push-push oscillator;

wherein said bisected resonator element presents an output tap between its bisected half-elements where there exists an RF null at the oscillating frequency of each of said pair of transistors and an anti-null at the output frequency of said push-push oscillator;

wherein the emitters of said pair of transistors are each connected to one of said bisected half-element of said resonator element, so that the output frequency of said push-push oscillator is twice the oscillating frequency of each of said pair of transistors at any instant in time and each of said pair of transistors operates in anti-phase at its fundamental frequency with respect to the other transistor;

wherein said source of DC voltage is connected to each of collectors of said pair of transistors;

wherein said source of variable DC tuning voltage is connected to each of said bases of said pair of transistors;

wherein said DC current source is connected to said output tap and thus to each of said emitters of said pair of transistors; and wherein a choke is connected to said output taps so as to permit DC current from said DC current source to pass, but so as to block signals from said output tap at the output frequency of said push-push oscillator from reaching said DC current source.

2. The push-push oscillator of claim 1, wherein said collectors of said pair of transistors are connected to each other.

3. The push-push oscillator of claim 1, wherein each of said base to collector inductive reactances is provided by lumped elements.

4. The push-push oscillator of claim 1, wherein said bisected resonator element is a single microstrip resonator, and said output tap is at the centre thereof.

5. The push-push oscillator of claim 4, wherein the highest output frequency to be derived there from is in the microwave frequency range, and the bandwidth of said range of output frequencies is in the microwave frequency range.

6. The push-push oscillator of claim 5, wherein each of said pair of transistors operates in the microwave frequency range.

7. The push-push oscillator of claim 5, wherein said bases of said pair of transistors are tied together through a pair of inductors.

8. The push-push oscillator of claim 5, wherein the inductive reactance path provided between the base and collector of each of said transistors is at least one microwave stub which is open-circuited within the range of oscillating frequencies of each transistor, and which is connected to each respective base.

9. The push-push oscillator of claim 5, wherein said collectors of said pair of transistors are connected to each other, wherein a virtual short circuit to ground at the oscillating frequency of each of said pair of transistors is developed at a point which is physically located midway between said collectors of said pair of transistors, and wherein a microwave stub is connected to said midway point so as to provide a virtual short circuit to ground at the output frequency of said push-push oscillator.

10. The push-push oscillator of claim 5, wherein the length of said microstrip resonator at each side of said output tap is at least one-quarter the wavelength of the oscillating frequency of the respective one of the said pair of transistors to which it is connected plus a sufficient extra length so as to provide a capacitive impedance at the oscillating frequency of each respective transistor where the function of said capacitive impedance is to contribute to the resonance circuit whereby the oscillating frequency of each said respective transistor is governed.

11. The push-push oscillator of claim 6, wherein said pair of transistors is a monolithic chip of a matched pair of transistors on a common substrate, and having their collectors connected through said common substrate, and wherein the base and emitter of each of said transistors has a connection pad located on the chip.

12. The push-push oscillator of claim 5, wherein each of said pair of transistors is a bipolar transistor.

13. The push-push oscillator of claim 12, wherein the output frequency of the oscillator is typically in the range of from about 9 GHz up to about 18 GHz, and the bandwidth of the range of output frequencies through which said output frequency is swept is about 1.5 GHz±based on a predetermined centre frequency, or 3.0 GHz bandwidth.

14. The push-push oscillator of claim 1, wherein said matched pair of transistors on a common substrate are mounted on a one-quarter wavelength open-circuited stub at the short circuit end thereof, where the length of said one-quarter wavelength stub is one-quarter the wavelength of the output frequency signal, and said one-quarter wavelength stub is mounted on a hybrid circuit board having a ground plane;

wherein a capacitor is placed on said one-quarter wavelength stub adjacent said transistors;

wherein said variable DC tuning voltage is connected to said capacitor; one of a pair of bond wire inductors, each of a predetermined length, is connected from said capacitor to the base connection pad of each of said pair of transistors; and the emitters of each of said pair of transistors are connected from their respective connection pads to the respective ends of a microstrip resonator element placed on said hybrid circuit board.

* * * * *